United States Patent
Shu et al.

(10) Patent No.: US 9,494,837 B2
(45) Date of Patent: Nov. 15, 2016

(54) MANUFACTURING METHOD OF TFT ARRAY SUBSTRATE, TFT ARRAY SUBSTRATE AND DISPLAY DEVICE

(71) Applicant: BOE TECHNOLOGY GROUP CO., LTD., Beijing (CN)

(72) Inventors: Shi Shu, Beijing (CN); Guanbao Hui, Beijing (CN); Teng Ye, Beijing (CN);
(Continued)

(73) Assignee: BOE Technology Group Co., Ltd., Beijing (CN)

( * ) Notice: Subject to any disclaimer, the term of this patent is extended or adjusted under 35 U.S.C. 154(b) by 161 days.

(21) Appl. No.: 14/366,525

(22) PCT Filed: Apr. 18, 2013

(86) PCT No.: PCT/CN2013/074376
§ 371 (c)(1),
(2) Date: Jun. 18, 2014

(87) PCT Pub. No.: WO2014/127573
PCT Pub. Date: Aug. 28, 2014

(65) Prior Publication Data
US 2016/0109739 A1    Apr. 21, 2016

(30) Foreign Application Priority Data
Feb. 22, 2013  (CN) .......................... 2013 1 0057631

(51) Int. Cl.
*H01L 27/12*    (2006.01)
*G02F 1/1368*   (2006.01)
(Continued)

(52) U.S. Cl.
CPC ........... *G02F 1/1368* (2013.01); *G02F 1/1362* (2013.01); *G02F 1/136209* (2013.01);
(Continued)

(58) Field of Classification Search
CPC .............. H01L 21/775; H01L 27/1259; H01L 27/1288
See application file for complete search history.

(56) References Cited

U.S. PATENT DOCUMENTS 5,818,550 A    10/1998 Kadota et al.
7,190,419 B2 *  3/2007 Park .................. G02F 1/136227
                                                    349/106
(Continued)

FOREIGN PATENT DOCUMENTS

CN    1512227 A    7/2004
CN    1624545 A    6/2005
(Continued)

OTHER PUBLICATIONS

First page of the Patent Certificate of the priority Chinese Application No. 201310057631.2 mailed Jan. 28, 2015.
(Continued)

*Primary Examiner* — Yu-Hsi D Sun
(74) *Attorney, Agent, or Firm* — Collard & Roe, P.C.

(57) ABSTRACT

Embodiments of the disclosure provide a manufacturing method of a TFT array substrate, a TFT array substrate and a display device. The method comprises steps of: S1. forming a thin film transistor on a base substrate; S2. forming a passivation layer thin film on the base substrate after the step S1; S3. forming a passivation layer via hole and a light-shielding pattern on the base substrate after the step S2; and S4. forming a color filter layer and a pixel electrode on the base substrate after the step S3. The pixel electrode is electrically connected to a drain electrode of the thin film transistor through the passivation layer via hole, and the color filter layer is in correspondence with a position of the pixel electrode.

5 Claims, 2 Drawing Sheets

(72) Inventors: Chunsheng Jiang, Beijing (CN); Cuili Gai, Beijing (CN)

(51) Int. Cl.
*G02F 1/1362* (2006.01)
*H01L 29/786* (2006.01)

(52) U.S. Cl.
CPC ....... *G02F 1/136227* (2013.01); *H01L 27/124* (2013.01); *H01L 27/1259* (2013.01); *H01L 27/1288* (2013.01); *H01L 29/78633* (2013.01); *G02F 2001/136222* (2013.01)

(56) References Cited

U.S. PATENT DOCUMENTS

| | | |
|---|---|---|
| 8,233,120 B2 | 7/2012 | Kim et al. |
| 8,411,219 B2 | 4/2013 | Kim et al. |
| 8,436,356 B2 | 5/2013 | Lee et al. |
| 8,928,831 B2 | 1/2015 | Liu |
| 2003/0020847 A1 | 1/2003 | Kim et al. |
| 2003/0117573 A1 | 6/2003 | Yi et al. |
| 2003/0153110 A1 | 8/2003 | Hotta et al. |
| 2005/0243235 A1 | 11/2005 | Lee |
| 2005/0275038 A1 | 12/2005 | Shih et al. |
| 2008/0153013 A1 | 6/2008 | Tung et al. |
| 2009/0256984 A1 | 10/2009 | Lee et al. |

FOREIGN PATENT DOCUMENTS

| | | |
|---|---|---|
| CN | 101034262 A | 9/2007 |
| CN | 101149541 A | 3/2008 |
| CN | 101533191 A | 9/2009 |
| CN | 101887897 A | 11/2010 |
| CN | 102147550 A | 8/2011 |
| EP | 2 395 551 A1 | 12/2011 |
| EP | 0 708 356 A2 | 9/2016 |
| KR | 1020060065979 | 4/2007 |

OTHER PUBLICATIONS

Chinese Office Action of Chinese Application No. 201310057631.2, mailed Jul. 14, 2014.
International Search Report, International Preliminary Report on Patentability and Written Opinion of the International Searching Authority of PCT/CN2013/074376 in Chinese, mailed Nov. 21, 2013.
International Search Report and Written Opinion of the International Searching Authority for PCT/CN2013/074376 filed on Apr. 18, 2013 in English mailed on Nov. 21, 2013. (Chinese documents submitted in the Jun. 18, 2014 Information Disclosure Statement.).
Published application for PCT/CN2013/074376 filed on Apr. 18, 2013 which received publication No. WO 2014/127573 A1 which was published on Aug. 28, 2014 in Chinese.
European Search Report in EP 13861514.1 dated Sep. 2, 2016.

\* cited by examiner

MANUFACTURING METHOD OF TFT ARRAY SUBSTRATE, TFT ARRAY SUBSTRATE AND DISPLAY DEVICE

CROSS REFERENCE TO RELATED APPLICATIONS

This application is the National Stage of PCT/CN2013/074376 filed on Apr. 18, 2013, which claims priority under 35 U.S.C. §119 of Chinese Application No. 201310057631.2 filed on Feb. 22, 2013, the disclosure of which is incorporated by reference.

TECHNICAL FIELD

Embodiments of the disclosure relate to a manufacturing method of a TFT array substrate, a TFT array substrate and a display device.

BACKGROUND

Thin film transistor-liquid crystal display (TFT-LCD) is featured with small size, low power consumption, no radiation and the like, and thus dominates in the current flat-panel display market.

The TFT-LCD mainly comprises an array substrate and a color filter substrate bonded with each other. A plurality of pixel regions are provided on the array substrate in a matrix form. A thin film transistor (TFT) and a transparent pixel electrode are formed in each of the pixel regions. A color filter layer formed of a red (R) resin, a green (G) resin and a blue (B) resin and a black matrix are formed on the color filter substrate. The black matrix is provided to correspond to the thin film transistor to prevent light leakage.

Because of a misalignment between the array substrate and the color filter substrate during a bonding process, a width of the black matrix (BM) has to be increased to avoid light leakage caused by this misalignment. However, the aperture ratio of the pixel region is reduced in the case that the width of the black matrix is increased, and thus the display effect is degraded.

According to one technique, the color filter layer is formed on the array substrate to solve the problem mentioned above. In this case, the sequence of manufacturing the array substrate is as follows: TFT—passivation layer—passivation layer via hole-color filter layer—planarization layer made of resin (for planarizing surfaces of R, G and B resin)-transparent pixel electrode; or TFT—passivation layer—color filter layer—planarization layer made of resin—passivation layer via hole—transparent pixel electrode. Patterns of the color filter layer and the planarization layer made of resin are formed by the process of: forming patterns of the R, G and B resin through patterning processes, and forming the pattern of the planarization layer made of resin through a patterning process. Therefore, no matter which sequence is adopted, exposure processes have to be performed during forming the color filter layer and the planarization layer made of resin and the exposure amount is relatively large, which will result in a damage to the active layer (generally comprising a semiconductor layer and a doped semiconductor layer). Thus, the performance of the TFT and the display quality of the display device are reduced.

According to one technique, a light-shielding pattern is formed above the TFT through an additional patterning process to solve the problem mentioned above. However, the additional patterning process for forming the light-shielding pattern will cause an increase in manufacture cost of the array substrate. In addition, if the light-shielding pattern and other patterns (for example, the passivation layer via hole) are formed through a single patterning process with a multi-tone mask plate, the manufacture cost of the mask plate is increased and thus the manufacture cost of the array substrate is increased.

SUMMARY

According to some embodiments of the disclosure, a manufacturing method of a TFT array substrate is provided. The method comprises steps of: S1. forming a thin film transistor on a base substrate; S2. forming a passivation layer thin film on the base substrate after the step S1; S3. forming a passivation layer via hole and a light-shielding pattern on the base substrate after the step S2; and S4. forming a color filter layer and a pixel electrode on the base substrate after the step S3. The pixel electrode is electrically connected to a drain electrode of the thin film transistor through the passivation layer via hole, and the color filter layer is in correspondence with a position of the pixel electrode.

According to some embodiments of the disclosure, a TFT array substrate is provided. The TFT array substrate comprises a thin film transistor, a passivation layer via hole, a color filter layer and a pixel electrode formed on a base substrate. The array substrate further comprises an light-shielding pattern provided above the thin film transistor, and a light-shielding conductive metal layer thin film for forming the light-shielding pattern is provided in the passivation layer via hole.

According to some embodiments of the disclosure, a display device is provided. The display device comprises the array substrate mentioned above.

In the TFT array substrate, the manufacturing method thereof and the display device according to the embodiments of the disclosure, the passivation layer via hole is formed through a single patterning process and the light-shielding pattern is formed in the photoresist stripping off process of the single patterning process. By providing the light-shielding pattern, the damage on the active layer of the thin film transistor due to large exposure amount during patterning processes is avoided. Accordingly, the performances of the TFT are guaranteed, and the display quality of the display device is improved. In addition, the manufacture cost of the array substrate is greatly reduced, especially in the case that a color filter layer is formed on the array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Referring to FIGS. 1-8, a manufacturing method of a TFT array substrate according to some embodiments of the disclosure comprises the following steps.

S1. Forming a thin film transistor on a base substrate.

Figure 1:
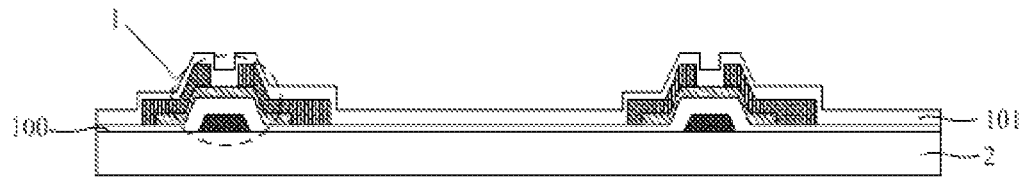
FIG. 1-FIG. 8 are schematic sectional views illustrating a manufacturing method of a TFT array substrate according to some embodiments of the disclosure.

As shown in FIG. 1, the thin film transistor 1 is firstly formed on the base substrate 2. For example, the base substrate 2 is made from a transparent material and is excellent in light transmission. For example, the base substrate 2 is a glass substrate, a quartz substrate or a transparent resin substrate.

For example, the array substrate comprises a gate line 20 and a data line 30 (see FIG. 9), the gate line 20 and the data line 30 intersect with each other to form a pixel unit region 40, and the thin film transistor 1 is formed in the pixel unit region 40. For example, the thin film transistor 1 is formed on the gate line 20.

The thin film transistor 1 is of a top gate structure or a bottom gate structure. The forming process of the thin film transistor 1 is described in detail below by taking the thin film transistor of the bottom gate structure as an example.

Figure 2:
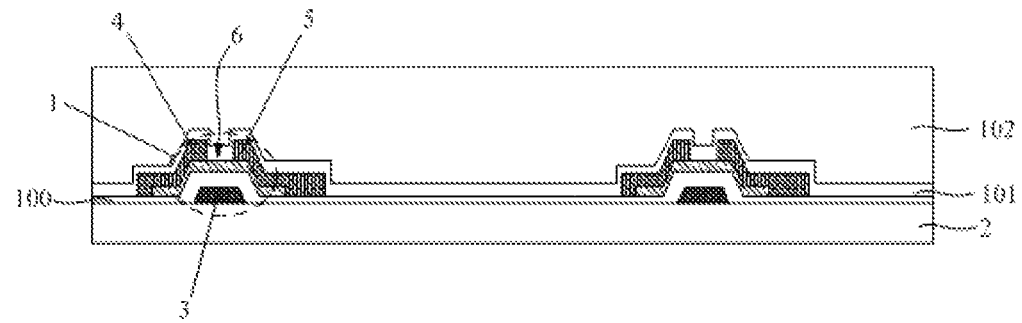

As shown in FIG. 1 and FIG. 2, a gate electrode pattern 3 is formed on the base substrate 2. For example, a gate metal layer thin film (not shown) is formed on the base substrate 2 through depositing, coating or sputtering process, and a patterning process is implemented on the gate metal layer thin film to form the gate electrode pattern 3. The patterning process for example comprises coating a photoresist on the gate metal layer thin film, exposing by using a normal mask plate, developing, etching, stripping off the photoresist, etc. For example, the etching is implemented by a wet etching process.

Then, a gate insulating layer thin film 100, an active layer thin film (not shown) and a source-drain metal layer thin film (not shown) are sequentially formed on the gate electrode pattern 3. The active layer thin film comprises a semiconductor layer thin film and a doped semiconductor layer thin film, and the doped semiconductor layer thin film is provided on the semiconductor layer thin film. For example, a source electrode pattern 4 and a drain electrode pattern 5 of the thin film transistor 1 as well as a gap 6 between the source electrode pattern 4 and the drain electrode pattern 5 are formed through multiple patterning processes, or the source electrode pattern 4, the drain electrode pattern 5 and the gap are simultaneously formed through a same patterning process. A channel region of the thin film transistor is formed by a portion of the active layer thin film in correspondence with the gap 6.

For example, the source electrode pattern 4 and the drain electrode pattern 5 of the thin film transistor 1 as well as the gap 6 between the source electrode pattern 4 and the drain electrode pattern 5 are formed through multiple patterning processes as follows. Firstly, the gate insulating layer thin film 100 and the active layer thin film are formed on the gate electrode pattern 3 through depositing, coating or sputtering process, and the active layer pattern (not shown) is formed by a patterning process with a normal mask plate. Then, the source-drain metal layer thin film is formed through depositing, coating or sputtering process, and the source electrode pattern 4 and the drain electrode pattern 5 of the thin film transistor 1 as well as the gap 6 therebetween are formed by another patterning process with another normal mask plate. The patterning process for example comprises coating a photoresist on the source-drain metal layer thin film, exposing by using the normal mask plate, developing, etching, stripping off the photoresist, etc. For example, a wet etching process is employed to form the source electrode pattern 4 and the drain electrode pattern 5 of the thin film transistor 1. For example, a dry etching process is employed to completely remove the doped semiconductor layer thin film between the source electrode 4 and the drain electrode 5 and partially remove the semiconductor layer thin film between the source electrode 4 and the drain electrode 5.

For example, the source electrode pattern 4 and the drain electrode pattern 5 of the thin film transistor 1 as well as the gap 6 therebetween are formed through the same patterning process as follows. Firstly, the gate insulating layer thin film 100, the active layer thin film and the source-drain metal layer thin film are sequentially formed on the gate electrode pattern 3 through depositing, coating or sputtering process, and then the source electrode pattern 4 and the drain electrode pattern 5 of the thin film transistor 1 as well as the gap 6 therebetween are formed by the same patterning process with a half-tone or gray-tone mask plate. The patterning process for example comprises steps as follows. Firstly, a layer of photoresist (not shown) is coated on the source-drain metal layer thin film. Then, exposure is implemented through the half-tone or gray-tone mask plate, so as to form a photoresist-completely-removed region, a photoresist-completely-reserved region and a photoresist-partially-reserved region. The photoresist-completely-reserved region corresponds to a region where the source electrode pattern 4 and the drain electrode pattern 5 are to be formed, the photoresist-partially-reserved region corresponds to a region which is provided between the source electrode pattern 4 and the drain electrode pattern 5 and where the channel region of the thin film transistor is to be formed, and the photoresist-completely-removed region corresponds to a region other than the regions mentioned above. After the developing process, a thickness of the photoresist of the photoresist-completely-reserved region is not reduced, the photoresist of the photoresist-completely-removed region is completely removed, and a thickness of the photoresist of the photoresist-partially-reserved region is reduced. Then, the source-drain metal layer thin film and the active layer thin film of the photoresist-completely-removed region are completely removed by a first etching process. For example, the source-drain metal layer thin film of the photoresist-completely-removed region is removed with a wet etching process, and the active layer thin film of this region is removed with a dry etching process. Meanwhile, the photoresist of the photoresist-completely-reserved region and the photoresist of the photoresist-partially-reserved region are thinned with the dry etching process. And then, the photoresist of the photoresist-partially-reserved region is removed through an ashing process to expose the source-drain metal layer thin film of this region. Then, a second etching process is performed to completely remove the source-drain metal layer thin film and the doped semiconductor layer thin film of the photoresist-partially-reserved region and partially remove the semiconductor layer thin film of the photoresist-partially-reserved region, so as to expose the semiconductor layer thin film of this region. For example, a wet etching process is employed to completely remove the source-drain metal layer thin film of the photoresist-partially-reserved region, and a dry etching process is employed to completely remove the doped semiconductor layer thin film of the photoresist-partially-reserved region and partially remove the semiconductor layer thin film of the photoresist-partially-reserved region. Finally, a remaining portion of the photoresist is stripped off to form the source electrode pattern 4 and the drain electrode pattern 5.

S2. Forming a passivation layer thin film on the base substrate after the step S1.

As shown in FIG. 1, the passivation layer thin film 101 is formed on the base substrate 2 after the step S1. For example, the passivation layer thin film 101 covering the entire base substrate 2 is formed through depositing, coating or sputtering process. For example, the passivation layer thin film 101 is a silicon nitride dielectric layer or a silicon oxide dielectric layer, or the passivation layer thin film 101 is a composite dielectric layer made from silicon nitride and silicon oxide.

S3. Forming a passivation layer via hole and a light-shielding pattern on the base substrate after the step S2.

The step for example comprises: forming the passivation layer via hole on the base substrate after the step S2 by a patterning process with a normal mask plate, and forming the light-shielding pattern during stripping off the photoresist.

For example, the forming the passivation layer via hole comprises the following steps.

Figure 3:
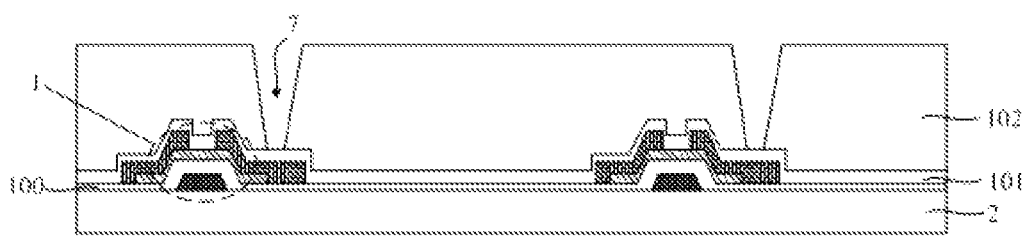
Figure 4:
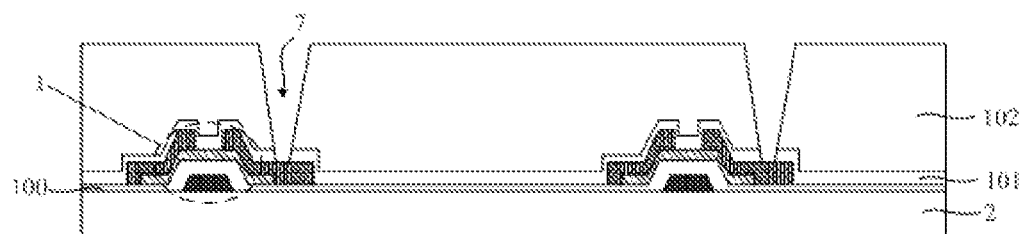

First of all, a layer of photoresist 102 is coated on the base substrate 2 after the step S2, as shown in FIG. 2. For example, the photoresist 102 is coated above the thin film transistor 1 and covers the entire base substrate 2;

Then, exposing and developing processes are implemented by using a mask plate, so as to form a photoresist-completely-removed region and a photoresist-completely-reserved region. The photoresist-completely-removed region corresponds to a region where the passivation layer via hole 7 is to be formed, and the photoresist-completely-reserved region corresponds to remaining regions, as shown in FIG. 3. For example, the passivation layer thin film 101 in the photoresist-completely-removed region is completely removed by a wet etching process, so as to form the passivation layer via hole 7 on the drain electrode 5 of the thin film transistor 1, as shown in FIG. 4;

For example, the forming the light-shielding pattern comprises the following steps.

Figure 5:
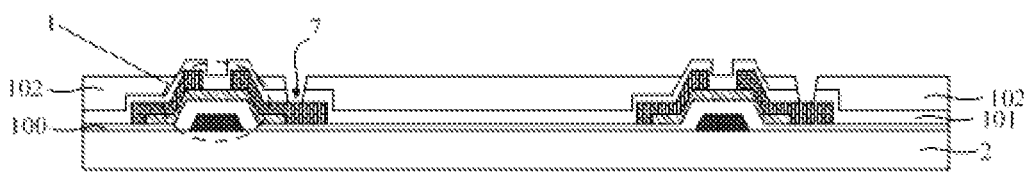

The photoresist 102 above the thin film transistor 1 is removed through an ashing process to expose the thin film transistor 1, as shown in FIG. 5. Because the thin film transistor 1 is higher than other regions than the thin film transistor 1, merely the thin film transistor 1 is exposed after the photoresist 102 is removed through the ashing process and other regions than the thin film transistor 1 is still covered by a remaining portion of the photoresist 102 which has a reduced thickness, as shown in FIG. 5. For example, a volume ratio of oxygen to sulfur hexafluoride in a gas adopted by the ashing process is 10-50 to remove the photoresist, so that merely the thin film transistor is exposed and other regions than the thin film transistor 1 is still covered by the remaining portion of the photoresist 102.

Figure 6:
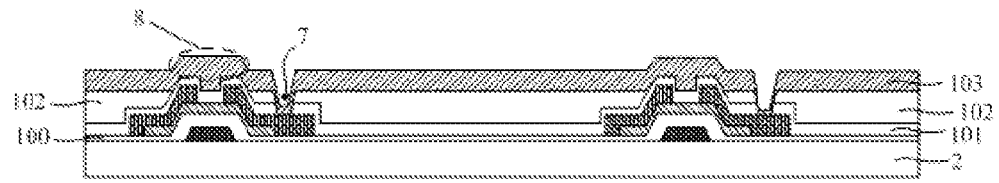

Then, a light-shielding conductive metal layer thin film 103 is formed above the thin film transistor 1 through depositing, coating or sputtering process to cover the entire base substrate 2, as shown in FIG. 6. For example, the light-shielding conductive metal layer thin film 103 is made from a conductive and light-shielding metal material such as molybdenum, aluminum, copper, etc.

Figure 7:
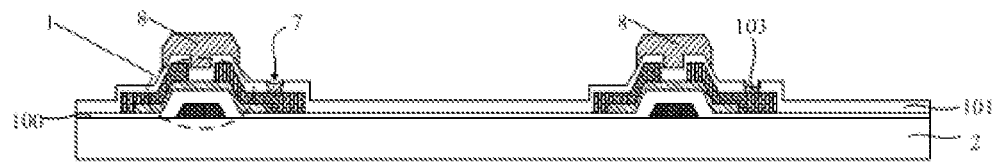

Finally, the remaining portion of the photoresist 102 is stripped off, to form the light-shielding pattern 8 above the thin film transistor 1. The light-shielding conductive metal layer thin film 103 still remains in the passivation layer via hole 7, as shown in FIG. 7. Although the light-shielding conductive metal layer thin film 103 in the passivation layer via hole 7 is not removed in the photoresist stripping off process, an electrical connection between a pixel electrode 9 and the drain electrode 5 of the thin film transistor 1 is not affected because the light-shielding conductive metal layer thin film 103 is conductive. In addition, an aperture ratio of the pixel unit region is not affected because the light-shielding pattern 8 is only formed above the thin film transistor 1.

The passivation layer via hole is formed through a single patterning process and the light-shielding pattern is formed in the photoresist stripping off process of the single patterning process. Accordingly, the manufacture cost of the array substrate is greatly reduced, especially in the case that a color filter layer is formed on the array substrate. In addition, the performances of the TFT are guaranteed, and the display quality of the display device is improved.

S4. Forming the color filter layer and the pixel electrode on the base substrate after the step S3. The pixel electrode is electrically connected to the drain electrode of the thin film transistor through the passivation layer via hole, and the color filter layer is in correspondence with a position of the pixel electrode.

The color filter layer 10 and the pixel electrode 9 correspond to each other in position. That is, the color filter layer 10 is provided below or above the pixel electrode 9 so as to display a color image.

For example, the color filter layer 10 comprises a red pattern (not shown), a green pattern (not shown) and a blue pattern (not shown). For example, the red pattern, the green pattern and the blue pattern are respectively formed through patterning processes. Hereinafter, the forming process of the red pattern is described in detail. The green pattern and the blue pattern are similarly formed, and details thereof are omitted.

Firstly, a red resin layer (not shown) is formed on the entire base substrate 2 with a coating dispersion process. For example, the resin layer is made of acrylic photosensitive resin or other carboxylic pigment resin. Then, the red pattern is formed by performing a patterning process on the red resin layer with a normal mask plate.

Figure 8:
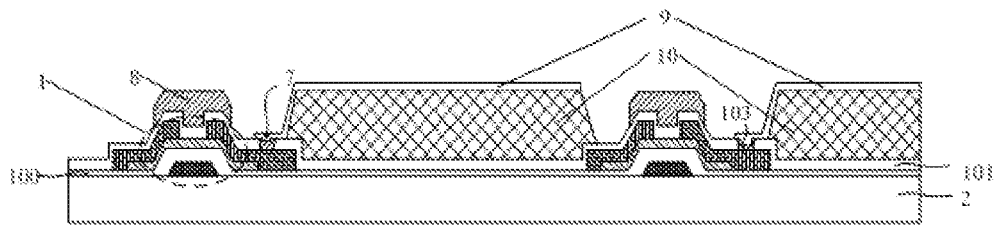

When the color filter layer 10 is formed below the pixel electrode 9 as shown in FIG. 8, the color filter layer 10 and the pixel electrode 9 are formed by the following steps. The red pattern, the green pattern and the blue pattern are formed on the base substrate 2 after the step S3. Then, the pixel electrode 9 is formed on the color filter layer 10. For example, a pixel electrode metal layer thin film (not shown) is formed on the red pattern, the green pattern and the blue pattern through depositing, coating or sputtering process, and the pixel electrode 9 is formed by performing a patterning process on the pixel electrode metal layer thin film. The pixel electrode 9 is electrically connected to the drain electrode 5 of the thin film transistor 1 through the passivation layer via hole 7.

When the color filter layer 10 is formed above the pixel electrode 9, the color filter layer 10 and the pixel electrode 9 are formed by the following steps. The pixel electrode 9 is formed on the base substrate 2 after the step S3. For example, the pixel electrode metal layer thin film (not shown) covering the entire base substrate is formed above the thin film transistor 1 through depositing, coating or sputtering process, and the pixel electrode 9 is formed by performing a patterning process on the pixel electrode metal layer thin film. The pixel electrode 9 is electrically connected to the drain electrode 5 of the thin film transistor 1 through the passivation layer via hole 7. Then, the red pattern, the green pattern and the blue pattern are formed on the pixel electrode 9.

Figure 9:
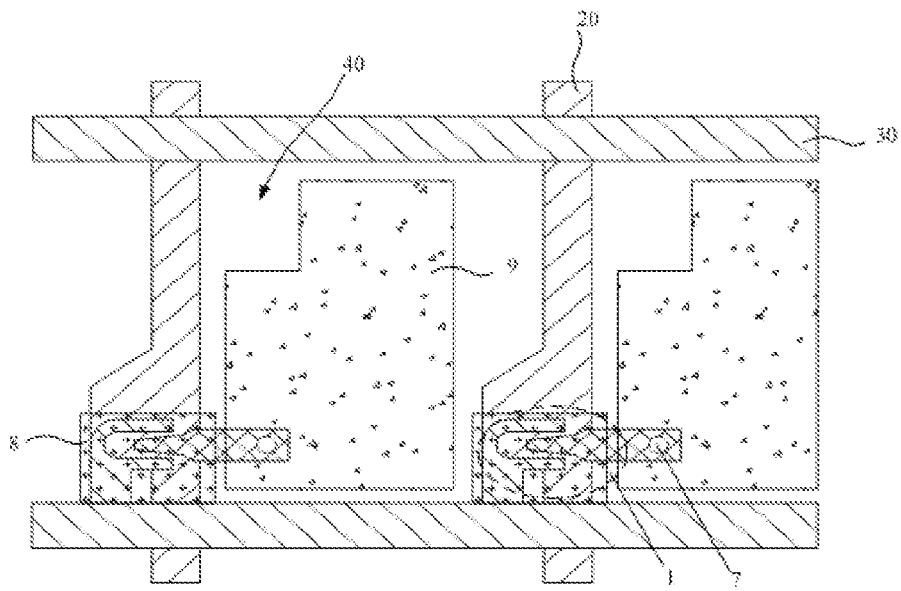
FIG. 9 is a top view illustrating an array substrate according to some embodiments of the disclosure.

According to some embodiments of the disclosure, an array substrate is provided. Referring to FIG. 8 and FIG. 9, the array substrate comprises the thin film transistor 1, the color filter layer 10 and the pixel electrode 9 formed on the base substrate 2. The color filter layer 10 corresponds to the pixel electrode 9 in position. The array substrate further comprises the light-shielding pattern 8 formed above the thin film transistor 1, and the light-shielding conductive metal layer thin film 103 for forming the light-shielding pattern 8 is provided in the passivation layer via hole 7. The pixel electrode 9 is electrically connected to the drain electrode of the thin film transistor 1 through the light-shielding conductive metal layer thin film 103 in the passivation layer via hole 7. By providing the light-shielding pattern 8, the damage on the active layer of the thin film transistor due to large exposure amount during patterning processes is avoided. Accordingly, the performances of the TFT are guaranteed, especially in the case that the color filter layer is formed on the array substrate. In addition, the manufacture cost is reduced.

According to some embodiments of the disclosure, a display device is provided. The display device comprises the array substrate as described above.

In the array substrate, the passivation layer via hole is formed through a single patterning process and the light-shielding pattern is formed in the photoresist stripping off process of the single patterning process. By providing the light-shielding pattern, the damage on the active layer of the thin film transistor due to large exposure amount during patterning processes is avoided. Accordingly, the performances of the TFT are guaranteed, and the display quality of the display device is improved. In addition, the manufacture cost of the array substrate is greatly reduced, especially in the case that a color filter layer is formed on the array substrate.

As described above, in the TFT array substrate, the manufacturing method thereof and the display device according to the embodiments of the disclosure, the passivation layer via hole is formed through a single patterning process and the light-shielding pattern is formed in the photoresist stripping off process of the single patterning process. By providing the light-shielding pattern, the damage on the active layer of the thin film transistor due to large exposure amount during patterning processes is avoided. Accordingly, the performances of the TFT are guaranteed, and the display quality of the display device is improved. In addition, the manufacture cost of the array substrate is greatly reduced, especially in the case that a color filter layer is formed on the array substrate.

The foregoing embodiments merely are exemplary embodiments of the disclosure, and not intended to define the scope of the disclosure, and the scope of the disclosure is determined by the appended claims.

What is claimed is:

1. A manufacturing method of a TFT array substrate, comprising steps of:
   S1. forming a thin film transistor on a base substrate;
   S2. forming a passivation layer thin film on the base substrate after the step S1;
   S3. forming a passivation layer via hole and a light-shielding pattern on the base substrate after the step S2; and
   S4. forming a color filter layer and a pixel electrode on the base substrate after the step S3,
   wherein the pixel electrode is electrically connected to a drain electrode of the thin film transistor through the passivation layer via hole, and the color filter layer is in correspondence with a position of the pixel electrode,
   wherein the forming the passivation layer via hole comprises:
   forming a layer of photoresist on the base substrate after the step S2;
   exposing and developing the photoresist by using a mask plate to form a photoresist-completely-removed region and a photoresist-completely-reserved region, wherein the photoresist-completely-removed region corresponds to a region where the passivation layer via hole is to be formed and the photoresist-completely-reserved region corresponds to remaining regions; and
   removing the passivation layer thin film of the photoresist-completely-removed region, to form the passivation layer via hole, and
   wherein the forming the light-shielding pattern comprises:
   thinning the photoresist of the photoresist-completely-reserved region through an asking process until the thin film transistor is exposed, wherein other regions than the thin film transistor is still covered by a remaining portion of the photoresist which has a reduced thickness;
   forming a light-shielding conductive metal layer thin film to cover the thin film transistor and other regions than the thin film transistor;
   stripping off the remaining portion of the photoresist to form the light-shielding pattern above the thin film transistor, wherein the light-shielding conductive metal layer thin film still remains in the passivation layer via hole.

2. The manufacturing method of the TFT array substrate according to claim 1, wherein a volume ratio of oxygen to sulfur hexafluoride in a gas adopted by the asking process is 10-50.

3. The manufacturing method of the TFT array substrate according to claim 1, wherein
   the step S1 comprises: forming a gate line and a data line on the base substrate; and
   the gate line and the data line intersect with each other to form a pixel unit region, and the thin film transistor is formed in the pixel unit region.

4. The manufacturing method of the TFT array substrate according to claim 1, wherein the step S4 comprises:
   forming a red pattern, a green pattern and a blue pattern on the base substrate after the step S3, wherein the color filter layer is formed by the red pattern, the green pattern and the blue pattern; and
   forming the pixel electrode on the color filter layer.

5. The manufacturing method of the TFT array substrate according to claim 1, wherein the step S4 comprises:
   forming the pixel electrode on the base substrate after the step S3; and
   forming a red pattern, a green pattern and a blue pattern on the pixel electrode, wherein the color filter layer is formed by the red pattern, the green pattern and the blue pattern.

* * * * *